United States Patent [19]

Gregerson

[11] Patent Number: 5,555,981
[45] Date of Patent: * Sep. 17, 1996

[54] WAFER SUSPENSION BOX

[75] Inventor: Barry Gregerson, Colorado Springs, Colo.

[73] Assignee: Empak, Inc., Chanhassen, Minn.

[*] Notice: The portion of the term of this patent subsequent to Dec. 28, 2010, has been disclaimed.

[21] Appl. No.: 425,259

[22] Filed: Apr. 18, 1995

Related U.S. Application Data

[63] Continuation of Ser. No. 136,316, Oct. 13, 1993, abandoned, which is a continuation-in-part of Ser. No. 887,965, May 26, 1992, Pat. No. 5,273,159.

[51] Int. Cl.⁶ ..................................................... B65D 85/90
[52] U.S. Cl. ........................................... 206/711; 206/454
[58] Field of Search ..................................... 206/328–334, 206/444, 454, 455, 587, 710–712; 211/40, 41

[56] References Cited

U.S. PATENT DOCUMENTS

| 1,838,411 | 12/1931 | Knorpp . |
| 4,043,451 | 8/1977 | Johnson . |
| 4,061,228 | 12/1977 | Johnson . |
| 4,160,504 | 7/1979 | Kudlich . |
| 4,450,960 | 5/1984 | Johnson . |
| 4,520,925 | 6/1985 | Johnson . |
| 4,555,024 | 11/1985 | Voss et al. . |
| 4,588,086 | 5/1986 | Coe . |
| 4,653,636 | 3/1987 | Armstrong . |
| 4,718,549 | 1/1988 | Rissotti et al. . |
| 4,793,488 | 12/1988 | Mortensen . |
| 4,880,116 | 11/1989 | Kos . |
| 4,966,284 | 10/1990 | Gregerson et al. . |
| 5,046,615 | 9/1991 | Nentl et al. . |
| 5,207,324 | 5/1993 | Kos . |

FOREIGN PATENT DOCUMENTS

| 2033436 | 2/1987 | Japan . |
| 62-188232 | 6/1989 | Japan . |
| 9216964 | 10/1992 | WIPO . |

Primary Examiner—Jimmy G. Foster
Attorney, Agent, or Firm—Haugen and Nikolai P.A.

[57] ABSTRACT

A ridged, transparent, thermoplastic package for transporting disk products such as wafers, semi-conductor wafers or computer memory disks is disclosed. Elastomeric or flexible thermoplastic cushions hold the disk products in a manner which precludes them from becoming damaged during normal shipping and handling. The cushions have a plurality of disk engaging members which individually engage a disk. The disk engaging member conforms to the edge profile of the substrate wafer to securely hold the wafer. Wafer rotation is eliminated, particle generation is reduced and the cushions securely hold the disk products.

4 Claims, 11 Drawing Sheets

WAFER SUSPENSION BOX

This is a continuation of copending application Ser. No. 08/136,316, filed on Oct. 13, 1993, abandoned, which is a continuation-in-part application Ser. No. 07/887,965, filed May 26, 1992, now U.S. Pat. No. 5,273,159.

BACKGROUND OF THE INVENTION

1. Field of the Invention

This invention relates to packages, and more particularly, to a package with replaceable resilient cushions for holding disk products such as substrate wafers, semi-conductor wafers or computer memory disks between which the wafers are suspended to prevent sliding or pivoting of the wafers on the edge profile, thus eliminating particle generation and damage to the wafers.

2. Description of the Prior Art

A variety of packages for holding and transferring substrate wafers are known in the prior art. For example, U.S. Pat. No. 5,046,615 to Nentl discloses a disk shipper device utilizing downwardly extending dentate leaves or resilient flanges in a row of crenate scallops in the cover to maintain the wafers or disks in an upright parallel spaced part alignment and provide secure positioning of the disks to prevent transverse or lateral motion within the last shipper.

U.S. Pat. No. 4,966,284 to Gregorson et al., discloses a substrate package container for storing and transporting substrate wafers. The container disclosed in this patent includes opposing rows of articulated cantilevered horizontal arms with centered V-grooves on each end for engaging the wafer.

U.S. Pat. No. 4,793,488 to Mortensen discloses a two part package for storing and transporting semiconductor wafers. This package contains a plurality of wafer contactors which exert a spring pressure against the wafers to secure the wafers in place.

U.S. Pat. No. 4,653,636 to Armstrong discloses a high temperature wafer boat. This wafer boat contains conventional ribs and a bottom supporting rib, side supporting rails and side retaining rails. These rails have aligned grooves to maintain the positioning of the wafers.

U.S. Pat. No. 4,588,086 to Koez discloses a two-part substrate carrier having a transparent lid. The base portion contains semi-circular V-shaped grooves. The cover also includes V-shaped grooves for engaging the top of the wafer.

The Voss et al. 4,555,024 patent discloses a packaging unit for semiconductor wafers which contains spring tongues in the base to support surfaces and inwardly projecting retention cones in the lid. The wafers are fixed at only four contact points. The goal of this design is to maintain minimal contact with the wafer.

U.S. Pat. No. 4,450,960 to Johnson discloses a package which is contoured and contains flexible fingers which space and secure the wafers and provides an upward pressure towards the package top with respect to the package bottom.

U.S. Pat. No. 4,160,504 to Kudlich describes a package having a plurality of parallel, laterally extending guide ribs formed opposite each other and a plurality of knobs which cooperate to maintain the disks in an upright position.

U.S. Pat. No. 4,043,451 to Johnson discloses still another shipping container for semiconductor wafers. The lid has interior wafer locating ribs and resilient, curved wafer supports beneath and over the edges of the wafer. The base contains an elongated panel of soft springy plastic with a corrugated wafer engaging face.

While significant improvements in disk package technology are set forth in the prior art references discussed above, real problems continue to exist even with the use of these prior art packages. Many of these problems arise given the nature of the disks which they are designed to contain. Such disks are easily breakable, easily scratched, and are therefore very fragile. Particles or other environmental contamination easily damage the substrate wafers. Certain other prior art packages described above can protect the disks from the external environment. However, when such packages are used, the disks have become damaged due to the packaging itself and from the internal environment of the package. The package interior becomes contaminated by particles which are generated as the disks pivot, slide or rotate on their edge profiles against the packaging. Internal contamination becomes more prevalent as the thermoplastics used to cushion or retain the disks in the package lose their elastic memory so that the disks are no longer securely held. This lose of elastic memory is known as flexural creep. When flexural creep occurs, the packaged disks can rotate or slide on their edge profiles generating particles which can damage or contaminate the wafer Substrates. Thus, these packages damage the highly sensitive face surfaces used in the manufacturing of integrated circuits in addition to the edges of the substrate wafers.

The present invention overcomes the disadvantages of the prior art by providing a novel cushion device in a ridged transparent, thermoplastic package having a base and a cover. The cushion is made from an elastomeric or flexible thermoplastic material having resilient characteristics which eliminate the rapid loss of elastic memory present in other disk cushion materials. A complementing elastomeric or flexible or rigid thermoplastic cushion may be located in the base so that when the package is used, the disks are sandwiched between the elastomeric cushions and firmly held in place by them. The configuration of the cushion incorporating independent disk engaging members, in addition to the material, aids in preventing damage to the disks.

The first cushion embodiment consists of a plurality of independent disk engaging members. Each disk engaging member has a flexible disk engaging edge and two legs extending perpendicular from the disk engaging edge on opposing ends. The plurality of disk engaging members are joined at the leg portions opposite the disk engaging edge. Each disk engaging member is resilient and independently deformable to securely engage the edge of a disk.

In a second cushion embodiment, the cushion has a plurality of disk engaging edges formed in a concave surface. Two legs extend perpendicular on either side of the wafer engaging edges formed in the concave surface.

The disk engaging edges on both these cushion embodiments have angled surfaces extending outwardly on either side. This allows the edge of the disk to be firmly centered and secured between the outwardly extending surfaces.

When the package is closed, the disks are firmly held between the cushions located in the package base and the package cover in such a way that the possibility of damage to the disk is greatly reduced as compared to the prior art packages discussed above.

SUMMARY OF THE INVENTION

The general purpose of the present invention is to provide a cushion arrangement for disk products capable of securing the wafers in such a way so that they are securely held in place and do not become damaged by particle generation in the interior environment of the package. The package must also be sealable by gasket tape, bag or some other method to prevent the wafers from being contaminated or damaged from the environment outside the package.

The package of the present invention consists essentially of three parts, a base, a cover, and cushion means. The cover and the base serve to fully enclose a cassette with disk products contained therein. Cassettes of the type contemplated are well known in the art. The use of these cassettes permits robotic handling of the disks. The use of a cassette to hold the set of disks to be packaged is optional in the present invention. An alternative embodiment eliminates the need for a cassette by incorporating a plurality of disk pockets in the side walls of the package base. The base and cover can then be sealed by gasket tape, a bag or some other method to prevent contamination from the exterior of the package.

The present invention is differentiated from the prior art by the removable elastomeric or flexible thermoplastic cushions associated with the base and cover. The cushions are present to eliminate relative motion of the disk products with respect to the various elements of the package during shipping. The cushions are removable to allow replacement of cushions no longer effective against particle generation. The present invention incorporates two cushion embodiments.

The first embodiment of the cushion consists of a plurality of independent disk engaging members. Each disk engaging member has a flexible disk engaging edge and two legs on opposing sides of the flexible disk engaging edge which extend transversely from the disk engaging edge. The plurality of independent disk engaging members are joined at the leg portions opposite the disk engaging edge. Each disk engaging member is resilient and independently deformable to securely engage the edge of a disk. When, for example, a cassette of disks is placed in the container, the edge of each disk comes in contact with a separate engaging member of the cushion. The engaging members deflect to conform to the shape of the associated disk. The edge of the disk becomes held between two angled surfaces which extend toward the disk and receive the edge of the disk.

Four cushion supporting members extend from the plurality of disk engaging members to support the cushion between the package cover and the disk carrying cassette.

The second embodiment of the cushion consists of a plurality of disk engaging edges formed in a concave surface. Two legs extend transversely on either side of the disk engaging edges formed in the concave surface. The second embodiment also has two angled surfaces which extend toward the disk and receive the edge of the disk as it is engaged by the disk engaging edge.

The arrangement of the cushions in the package can vary. The first embodiment of the cushion may be located in both the cover and the base, or in just the cover. The second embodiment of the cushion may be used in the base when the first embodiment or other conventional cushions are located in the cover.

When the cover is closed the extending members of the cushions or cushion individually engage the edge profile of the disk products. The cushions or cushion cooperate to firmly hold the disk products in place so that they do not rub against the two cushion embodiments or the interior structures of the box or cassette, creating particles which can then contaminate or damage the disks. This is achieved because the cushions do not permit the disks to pivot or slide or rotate on their edge profiles in the box during assembly or in transport.

With this summary in mind, it is clear that a principle object of the present invention is to provide a package for transporting and storing semiconductor wafers, the disk products such as substrate wafers or computer memory disks.

A further object of the present invention is to suspend a plurality of disks in a package which eliminates the negative effects of the shock and vibration experienced during shipment of the disks by having an upper cushion with a flat deformable portion applying spring pressure to the wafers to eliminate problems associated with vibrational movement and compressing the flat portion of the cushion to a rigid perpendicular structure for preventing movement of the wafer under more severe shock loading.

Another object of the present invention is to provide a cushion which independently engages semiconductor wafers, disks or substrates wafers or computer memory disks.

Yet another object of the present invention is to provide a high technology, state of the art package for storing and transporting semi-conductor wafers, substrate wafers or computer memory disks which can be manipulated either manually or robotically.

Still another object of the present invention is to provide a package which eliminates contamination of the disk products from the exterior environment during shipment and handling.

Another object of the present invention is to provide a wafer package which prevents the generation of particles inside the package which can contaminate or damage the fragile disks.

Another object of the present invention is to provide a package which suspends the disks between the elastomeric or flexible thermoplastic cushions to eliminate pivoting or sliding of the disks and keeps the disks from rubbing against internal structures of the package, cassette or cushion embodiments so that the disks do not become contaminated.

A further object of the present invention is to provide elastomeric or flexible thermoplastic cushions which are easily replaceable and inserted.

Still another object of the invention is to provide cushions which have minimal flexural creep or elastic memory loss and are easily replaced so that the consistency in performance of the package is increased.

A further object is to provide such resilient cushions in the base and cover of the package which are concave or deformable to conform to the edge of the disks to be held, and include angled surfaces which help center the edge of the disk on the cushion.

Another object of the invention is to reduce the amount of padding required in secondary packaging and size therefore reducing shipping costs by securely cushioning the packaged disks.

DESCRIPTION OF THE DRAWINGS

These and other objects of the invention will become more readily apparent from the following detailed description taken in conjunction with the accompanying drawings in which.

DETAILED DESCRIPTION OF THE PREFERRED EMBODIMENT

Figure 1:
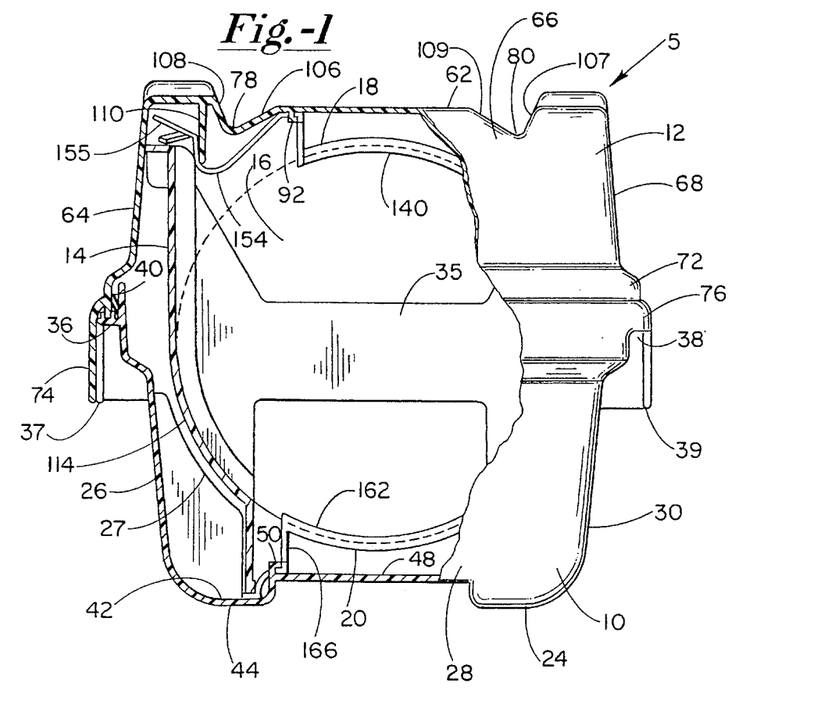
FIG. 1 is a front view of the disk product package partially cut away to show the disk in a disk carrier in the substrate package interior.
Figure 2:
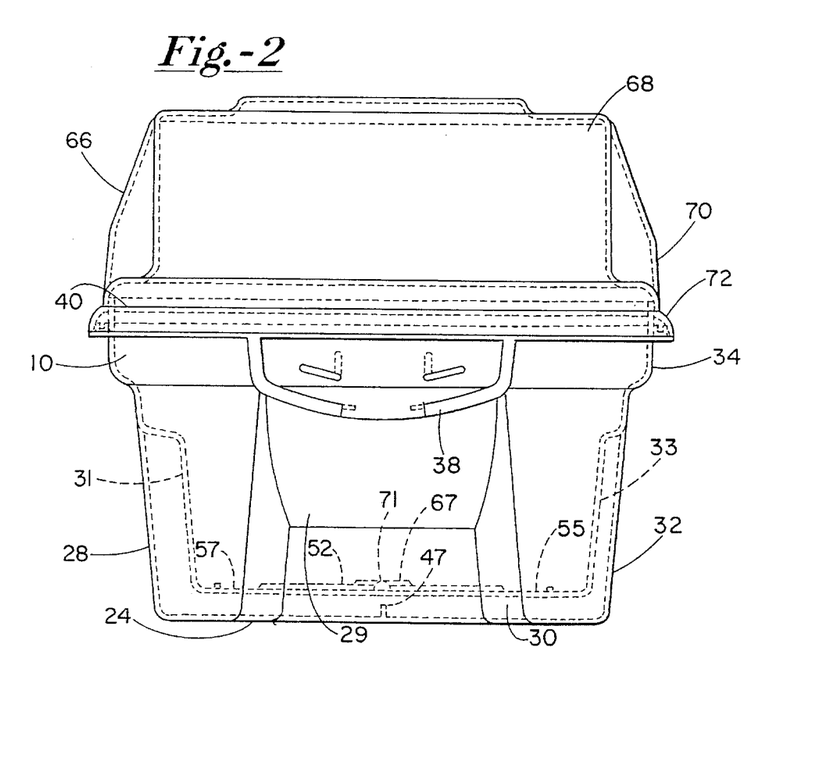
FIG. 2 is a side view of the disk product package.

FIG. 1 shows a partially cut away front view of package 5. The package includes a base 10, a cover 12 and an internal disk carrying cassette 14. Also shown is a disk 16 located in cassette 14 and the end views of removable cushions 18 and 20 between which the disk is firmly secured. FIG. 2 shows a side view of package 5 with interior features show in hidden line.

Figure 3:
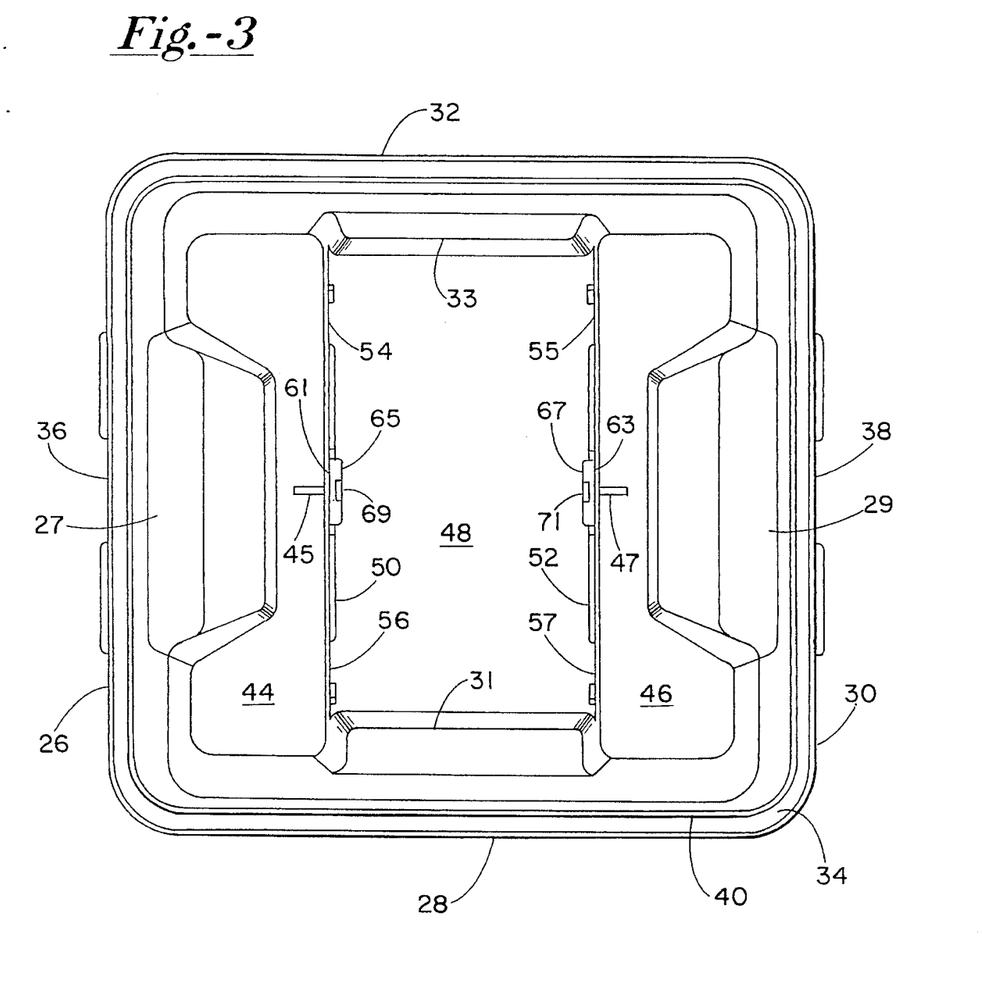
FIG. 3 is a plan view of the package bottom interior of FIG. 1.

The base 10 and cover 12 of package 5 are preferably made of a rigid and transparent thermoplastic for wafer visibility. The base 10, as shown in FIGS. 1, 2, and 3, has a bottom surface 24 and four integral walls 26, 28, 30 and 32 extending up from bottom surface 24. An outwardly projecting rim 34 to mate with a corresponding rim on cover 12 to be described later is located along the top of the walls 26, 28, 30 and 32. Rim 34 on opposing walls 26 and 30 contains latch members 36 and 38. The latches can be any suitable latches depending upon the packaging requirements. These latches each contain a flange shown as 37 and 39 respectively. The package seam shown contains seal 40 for creating an airtight seal. This seal can be any conventional seal. The walls 26 and 30 are indented below the latch members, as at 27 and 29. The indentation may conform to the configuration of the cassette as shown in FIG. 1 at 27. This helps to position the cassette. The indentation is also for ease in human handling of the package. Likewise, the base walls are also indented on side 28 at 31 and side 32 at 33 for positioning of the cassette by conventional indexing. Indentation 31 is the H bar end which indexes with the H bar end 35 of the cassette for proper positioning of the cassette in the base as is commonly known in the industry.

The bottom 24 contains a first lower surface 42 which forms two channels 44 and 46 for receiving the base of the cassette 14 carrying the wafers. Each channel contains an indexing rib, shown as 45 and 47 respectively, for mating with the carrier 14 as will be described later. A raised surface 48 is located along the length of the bottom center. This raised surface 48 contains two spaced apart parallel tracks 50 and 52 located on opposing sides of the raised surface 48. These tracks 50 and 52 include a vertical wall extending the length of the raised surface 48. Track 50 is cut away in two locations, 54 and 56, for supporting the second cushion embodiment as will be described later in further detail. Likewise, track 52 is also cut away at two locations, 55 and 57, for supporting the second cushion embodiment. Each track also has an L-shaped portion 61 and 63 containing a wall 65 and 67 projecting transverse from the vertical wall for securing the cushion to the base. Each projecting portion contains a recess 69 and 71, respectively, for securing the cushion as will be explained later.

Figure 14:
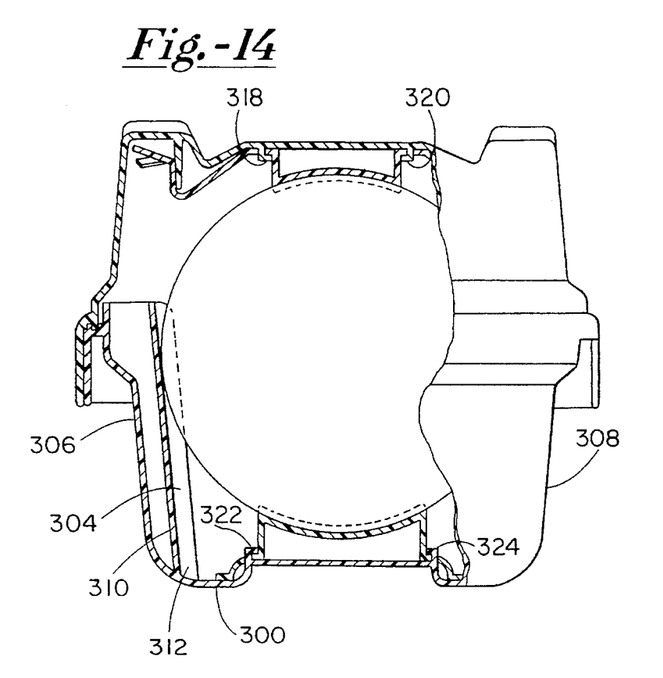
FIG. 14 is a partially cut away cross sectional view of an alternative embodiment of the invention not requiring a wafer carrier.

The cover 12, as shown in FIGS. 1, 2 and 14, includes a upper surface 62 with four integral walls 64, 66, 68 and 70. An outwardly projecting rim 72 is located along the edge of the walls for mating with the rim 34 to provide a surface for tape sealing the package. Rim 72 at walls 64 and 68 contains latch members 74 and 76 for engaging the base latch members 36 and 38.

Figure 4:
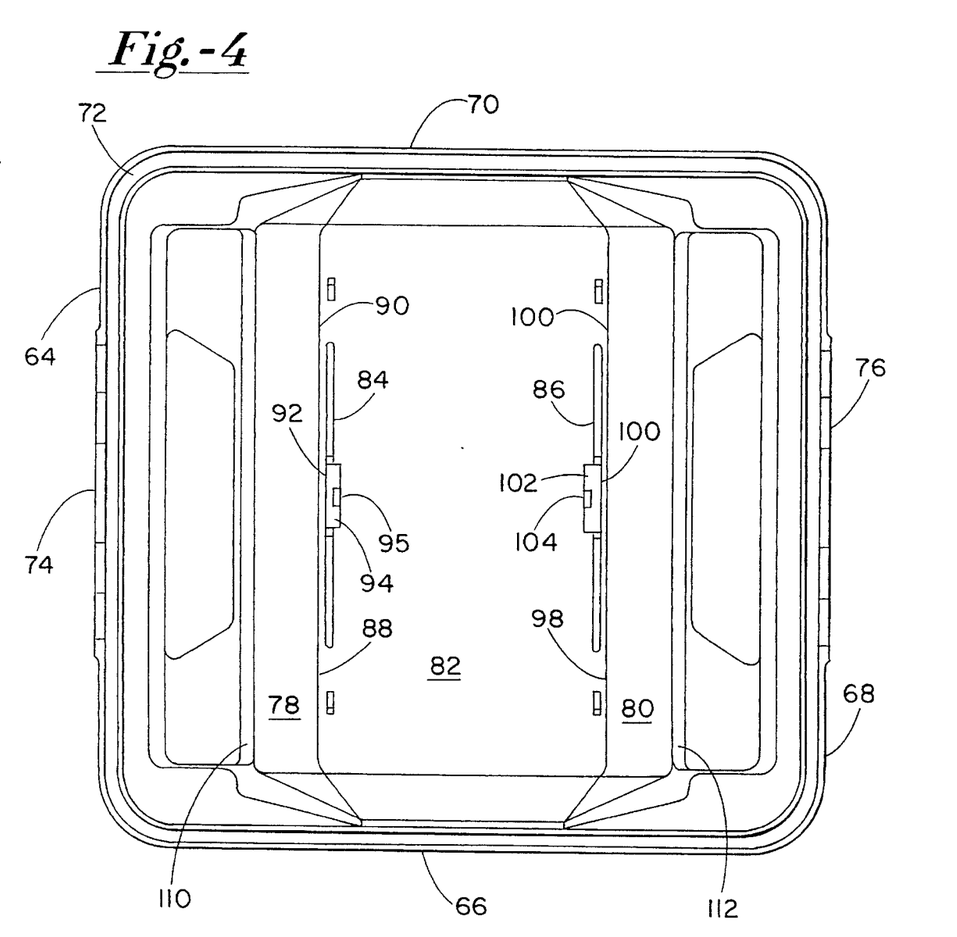
FIG. 4 is a plan view of the package cover interior of FIG. 1.

The cover 12 has an upper surface containing two parallel indentations 78 and 80. A central surface area 82 located between the two indentations, 78 and 80 contains two spaced apart parallel tracks 84 and 86 similar to those in the bottom of the package. Track 84 includes a vertical wall cut away at 88 and 90 to provide for securing the cushion and an L-shaped portion 92 for also securing the cushion. This L-shaped portion 92 has a transverse member 94 containing a recess 95 for securing the cushion as will be described in detail later. Likewise track 86 has a vertical wall cut away at 96 and 98 and an L-shaped portion 100. The L-shaped portion contains transversely projecting wall 102 and recess 104.

The indentation 78 contains a first angled wall 106 and a second angled wall 108 as shown in FIG. 1. An interior wall 110 is located adjacent the second angled wall 108. Indentation 80 likewise has a first angled wall 109 and a second angled wall 107 as shown in FIG. 1. A second interior wall 112 is located adjacent indentation 80. The two interior walls 110 and 112 are parallel to each other.

The cassette to be used is a conventional disk carrier. As shown in FIG. 1, cassette 14 has opposing rounded side walls, one of which is shown as 114. The cassette has a configured "H" shaped member 35 for proper indexing in the base as is commonly done in the disk product industry. The cassette 14 also contains indexing notches (not shown) along its lower side walls. These notches are configured to mate with the indexing ribs 45 and 47 located in the base channels 44 and 46. The cassette can be configured for robotic handling and can be used for shipping and storage and/or processing. The cassette is made of a suitable polymer such as polycarbonate, polypropylene, polyethylene, teflon, or other like materials.

Turning now to FIGS. 1 and 5–13, the cushions 18 and 20 between which the wafers are suspended will be discussed. The cushions are preferably made of elastomer, flexible thermoplastic or other materials which preferably have properties of minimal flexural creep and loss of elastic memory such as polyvinylidene fluoride (PVDF). More specifically, materials with flexural creep within the range of 0.25 to 1.5% deflection at 60° C. when measured in accordance with ASTM test standard D2990 are preferable, but the cushion material is not limited to such a material.

Figure 5:
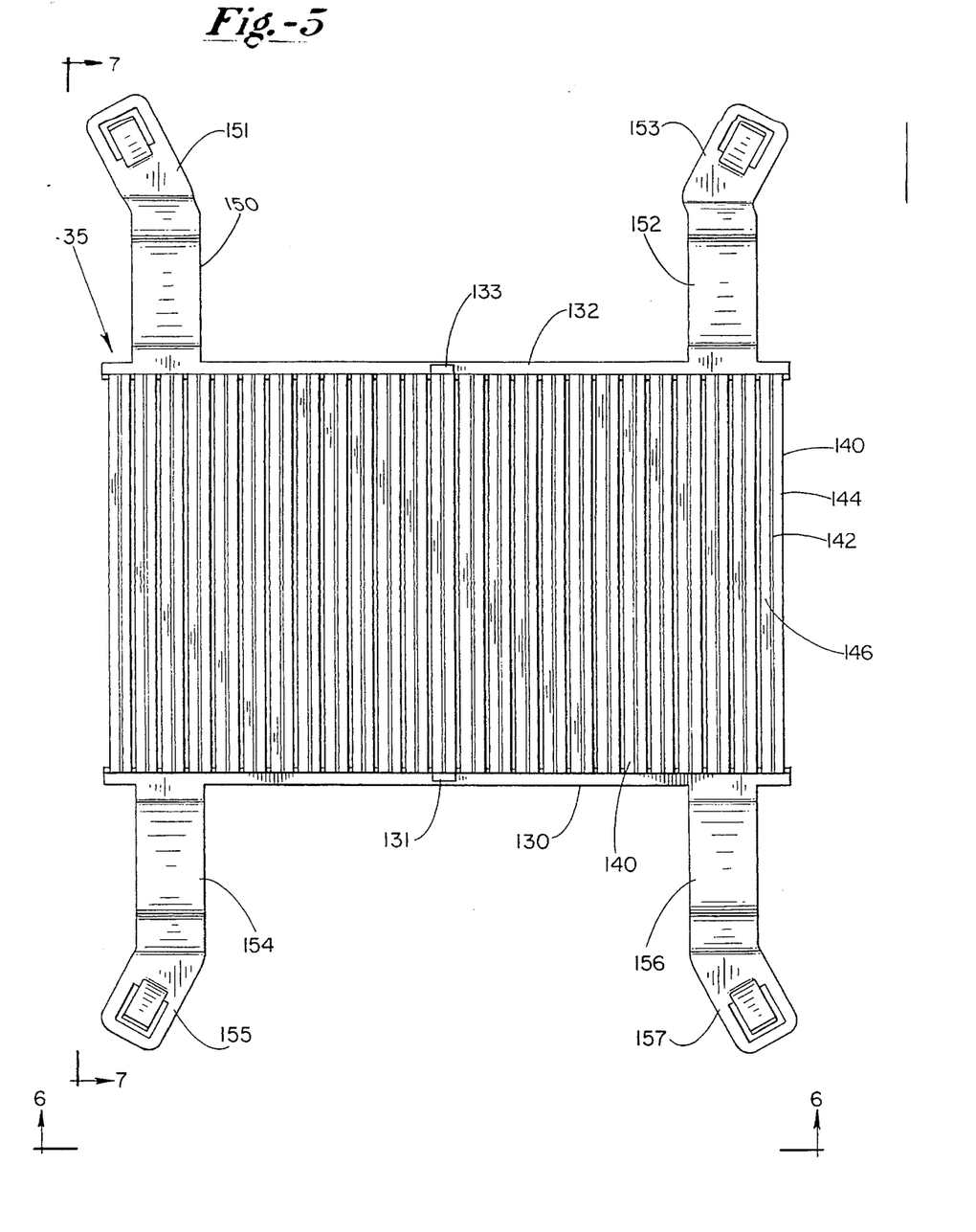
FIG. 5 is a plan view of a first cushion embodiment of the invention.

In the first cushion embodiment, each cushion has two parallel rails 130 and 132 designed to engage and be retained by the parallel tracks 50 and 52 of the bottom 10 or tracks 82 and 84 of cover 12 as will be explained further. This first cushion embodiment consists of a plurality of independent disk product engaging members, designated generally as 135, which extend from the rails 130 and 132. The members 135 are spaced according to the spacing of the disks in the cassette to be packaged and can hold disks of varying diameter. These disk engaging members 135 are essentially a plurality of individual flexible cushions which individually provides cushion for an individual disk.

Figure 6:
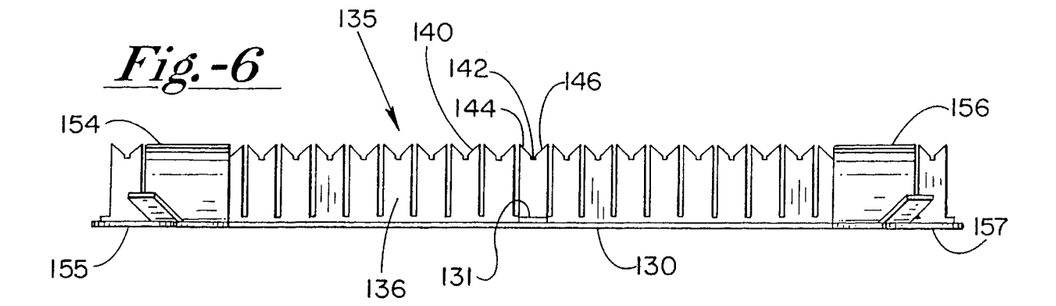
FIG. 6 is a side view of the first cushion embodiment of the invention of FIG. 5.
Figure 7:
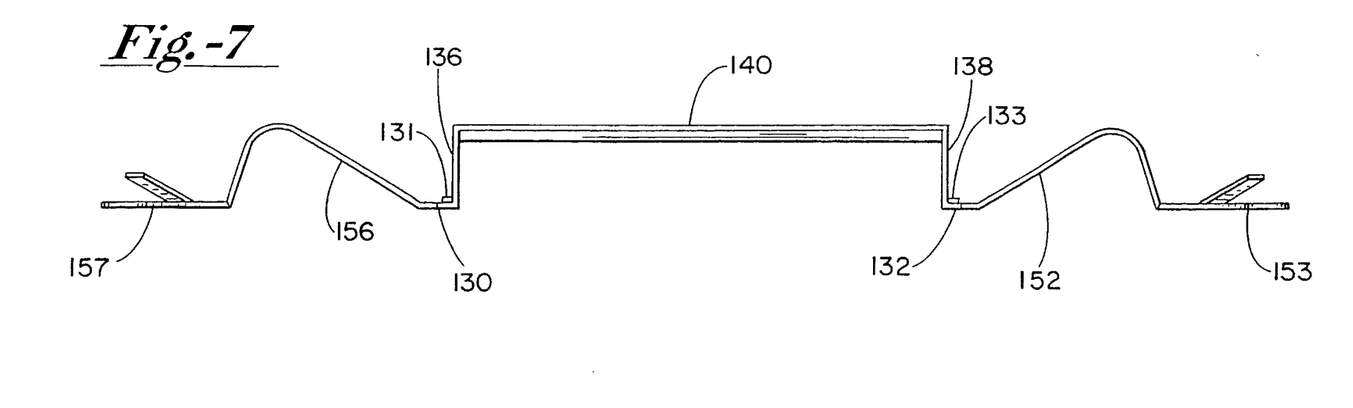
FIG. 7 is an end view of the first cushion embodiment.

Each disk engaging member 135 has a first and second leg, representative areas designated as 136 and 138, extending transversely from a flexible disk engaging edge 140. The plurality of independent disk,engaging members 135 are joined at their leg portions opposite the disk engaging edge 140 just prior to the rails as shown in FIG. 6. The rails each have a securing protrusion 131 and 133. This securing protrusion is configured for engagement with the L-shaped track portions 92 or 102 of the cover.

Figure 11A:
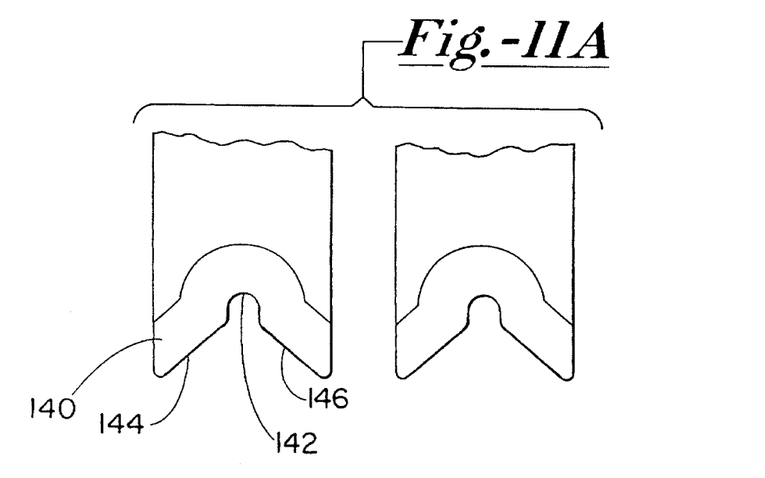
FIGS. 11a–c are enlarged section views showing the various embodiments of the disk engaging edge of the cushion.
Figure 13A:
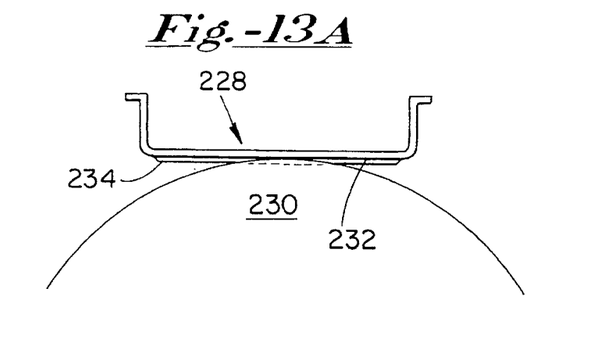
FIG. 13a–c are front views of the disk profile engaged a cushion of the invention.
Figure 13B:
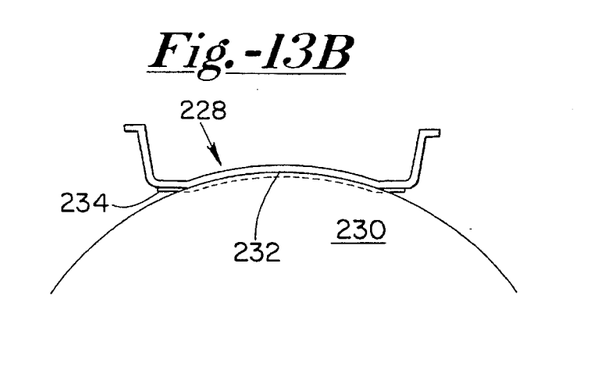
Figure 13C:
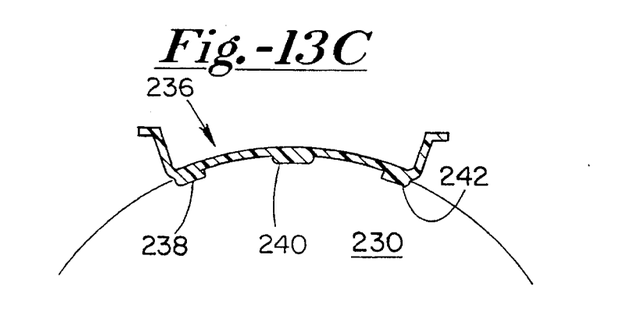

Each disk engaging member 135 is resilient and independently deformable to securely engage the edge of a disk. The disk engaging edge 140 may contain angled surfaces to help center the disk in the disk receiving receptacle. As shown in FIG. 11, each disk engaging portion 140 has a U-shaped receptacle 142. A first and second angled surface, 144 and 146 respectively, extends outward on either side of the U-shaped receptacle 142. The angled surfaces 144 and 146 help center the disk as described later. The angled surfaces 144 and 146 of the disk engaging portion 140 do not need to be continuous. A segmented design of the angled surfaces is an alternative cushion design which still provides the centering function. As shown in FIG. 13c, disk engaging surface 236 extends across the width of the cushion. The spaced apart angled surfaces 238, 240 and 242 extend from the disk engaging surface 236 for centering disk 230 into the disk engaging surface. The cushions are resilient and each member 134 conforms to its respective disk edge profile, as will be described in further detail later, to securely hold the disk.

Figure 11B:
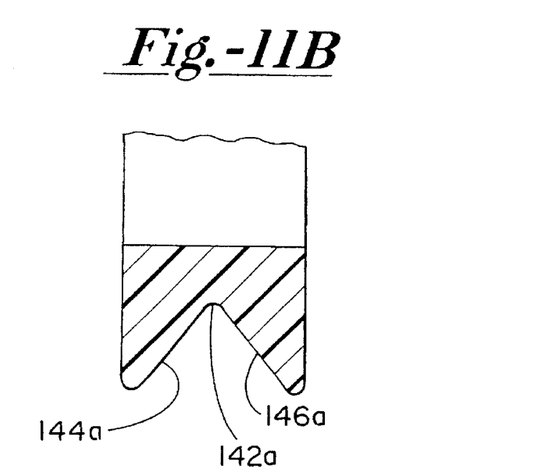
Figure 11C:
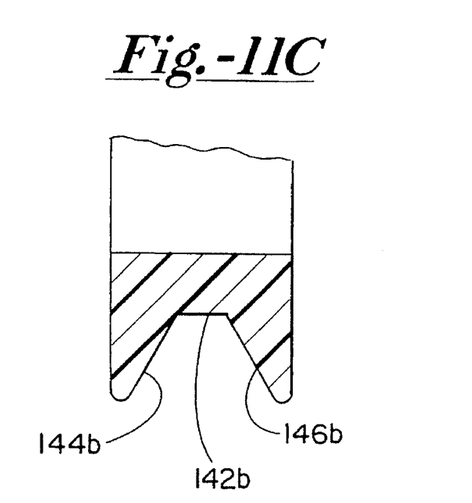

FIGS. 11B and 11C show optional cross sectional configurations of the cushion. FIG. 11C contains angled surfaces 144a and 146a to help center the disk edge into the disk receiving area 142a. Likewise FIG. 11C contains angled surfaces 144b and 146b to help center the disk edge into the flat disk receiving area 142b. The first cushion embodiment is not limited to these configurations of the disk engaging edge, any suitable disk receiving configuration may be used.

Figure 12:
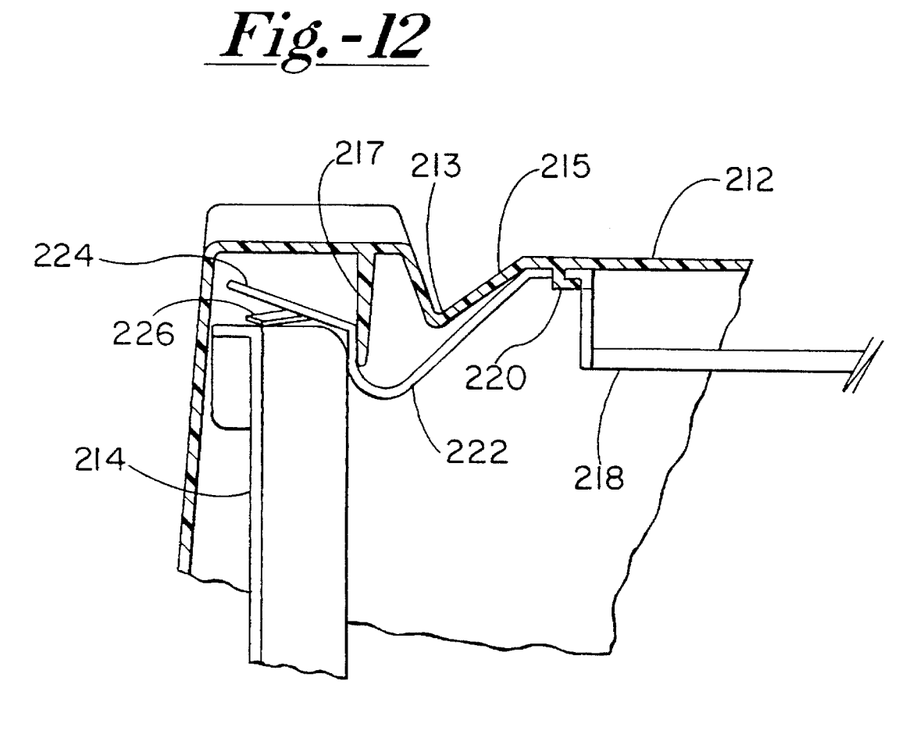
FIG. 12 is a sectional view showing the first cushion embodiment positioned in a disk product package.

The first cushion embodiment also includes four supporting members 150, 152, 154 and 156 which are located adjacent each edge of the disk cushion. These supporting members 150, 152, 154 and 156 rest between the disk carrying cassette and the package cover. The cut away portions 88, 90, 98 and 100 on the tracks 84 and 86 allow the supporting members to extend through the tracks. FIG. 12 shows a partial end view of a cover 212 with cassette 214 and cushion 218. Cushion 218 is secured to the cover 212 by L-shaped track portion 220 and supporting member 222. Supporting member 222 extends through the track which follows wall 215 of indentation 213. Supporting member 222 is then secured between wall 217 and cassette 214. The end of the supporting member 222 contains a flange 226 which rests on top of cassette 214 and a flange 224 which angles away from flange 226.

Figure 8:
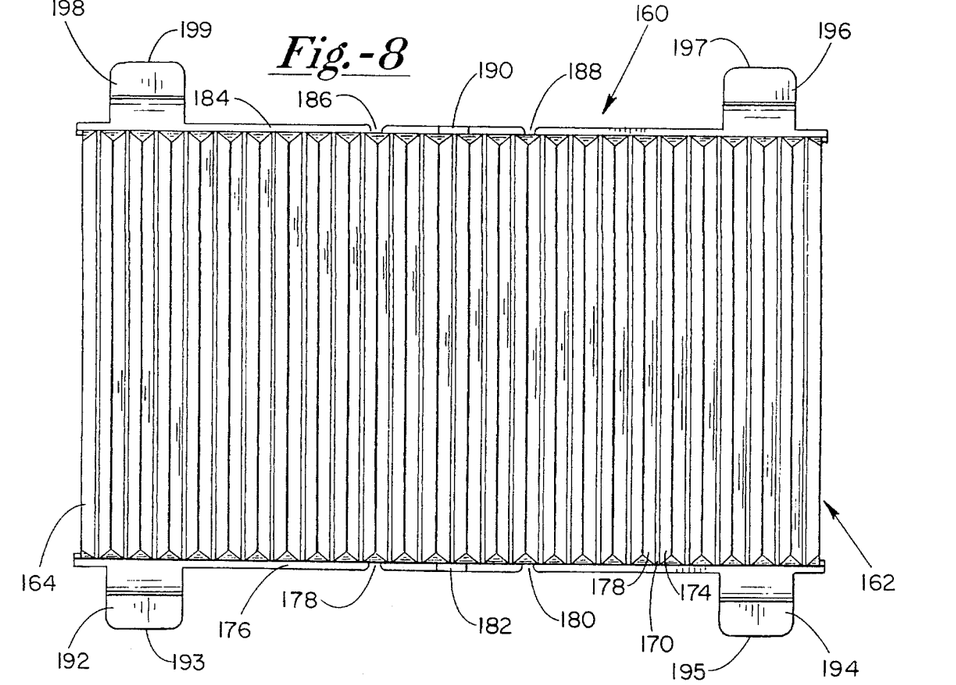
FIG. 8 is a top plan view of a second cushion embodiment of the present invention.
Figure 9:
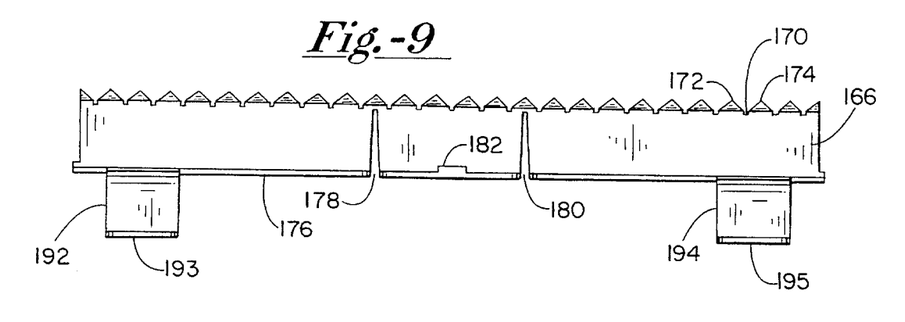
FIG. 9 is a side view of the second cushion embodiment of the present invention.
Figure 10:
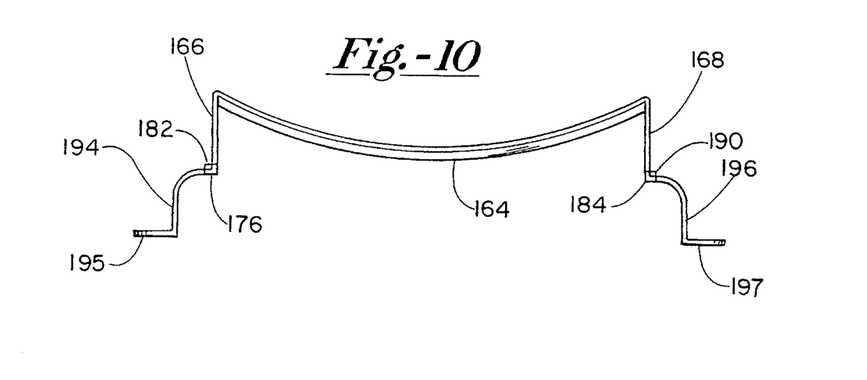
FIG. 10 is an end view of the second cushion embodiment of the present invention.

The second cushion embodiment 160, shown in FIGS. 8–10, has a plurality of disk engaging surfaces, designated generally as 162, formed in a concave surface 164. Two legs 166 and 168 extend transverse to the concave surface 164 on either side of the disk engaging surfaces 162. Each disk engaging surface includes a disk engaging edge, one of which is designated 170 with angled surfaces 172 and 174. This second embodiment of the cushion can also have various designs of the angled surfaces 172 and 174 to help center the disk into the disk engaging surface 170, such as the ones found in the first cushion embodiment and shown in FIGS. 11A–11C.

This second cushion embodiment 160 has a structure similar to the first cushion embodiment for securing the cushion to the container. The lower edge of the legs 166 and 168 contain a rail. The rail 176 on leg 166 is segmented due to the notches 178 and 180 cut into leg 166. A securing protrusion 182 is located on the central portion of a rail 176. This securing protrusion 182 is configured to engage recess 69 on rail 50 of the base. Likewise, leg 168 contains rail 184. Rail 184 is segmented due to notches 186 and 188. A securing protrusion 190 is located on the central area of rail 184. This securing protrusion 190 is configured to engage recess 71 on rail 52 of the base.

The second cushion embodiment also has four supporting members 192, 194, 196 and 198 extending from each corner. These supporting members have a downwardly extending arcuate portion and ledges at the bottom of the arcuate portion which are designated 193, 195, 197 and 199. The arcuate portions extend through the track cut away portions 54, 55, 56 and 57 so the ledges 193, 195, 197 and 199 rest on the bottom surface of the channels 44 and 46. The disk cassette carrier 14 rests on the top of these ledges to additionally secure this second cushion embodiment in the package base. Instead of four supporting members, the cushion may only have one securing member extending on each side of the cushion.

The present invention has several alternative embodiments which pertain to the placement of the disks and cushions in the interior of a package box.

The first alternative embodiment is shown in FIG. 14. This embodiment eliminates the need for a cassette to hold the disks. The base 300 contains a plurality of alternating disk pockets and ribs similar to those found in the cassette of FIG. 1 on side walls 306 and 308. FIG. 14 shows a representative pocket 304 cut away. The pocket has a base wall 310 and side wall 312. The base of this embodiment does not require the channels with locator ribs or a lip with a locator index member for accommodating a cassette. The cushion features are those of the original embodiment of the invention with first cushion embodiment 314 and second cushion embodiment 316 secured to the package by the securing L-shaped track portions 318, 320, 322 and 324.

Figure 15:
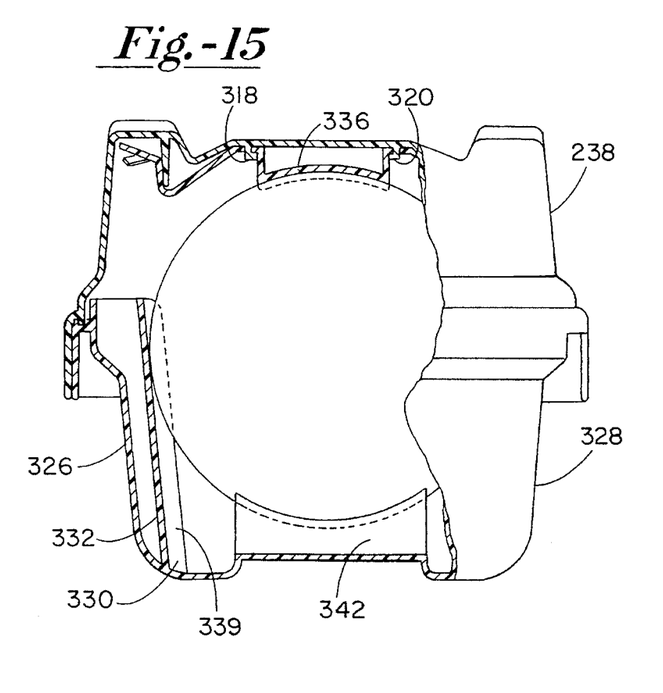
FIG. 15 is a partially cut away cross sectional view of a first alternative embodiment incorporating one cushion of the invention.

A second alternative embodiment is shown in FIG. 15. This embodiment is similar to the embodiment in FIG. 14 which eliminates the need for a disk cassette by incorporating a plurality of alternating disk pockets and ribs on walls 326 and 328. A representative side pocket 330 on the side is shown cut away with a base wall 332 and side wall 334. This embodiment also contains only one cushion 326. The one cushion is preferably located in the cover 338, but can be located in the base 340. If the cushion is located in the cover, a plurality of disk pockets similar to those on the side walls 332 and 334 are located in the bottom at 342 to replace the lower cushion. These cushion replacing pockets ideally have a curvature similar to the disk being held as shown in FIG. 14. The cushion can also be located just in the base 340. The cover 338 can have curved wafer pockets or a wafer engaging arrangement such as shown in U.S. Pat. No. 4,966,284 incorporated herein by reference.

Figure 16:
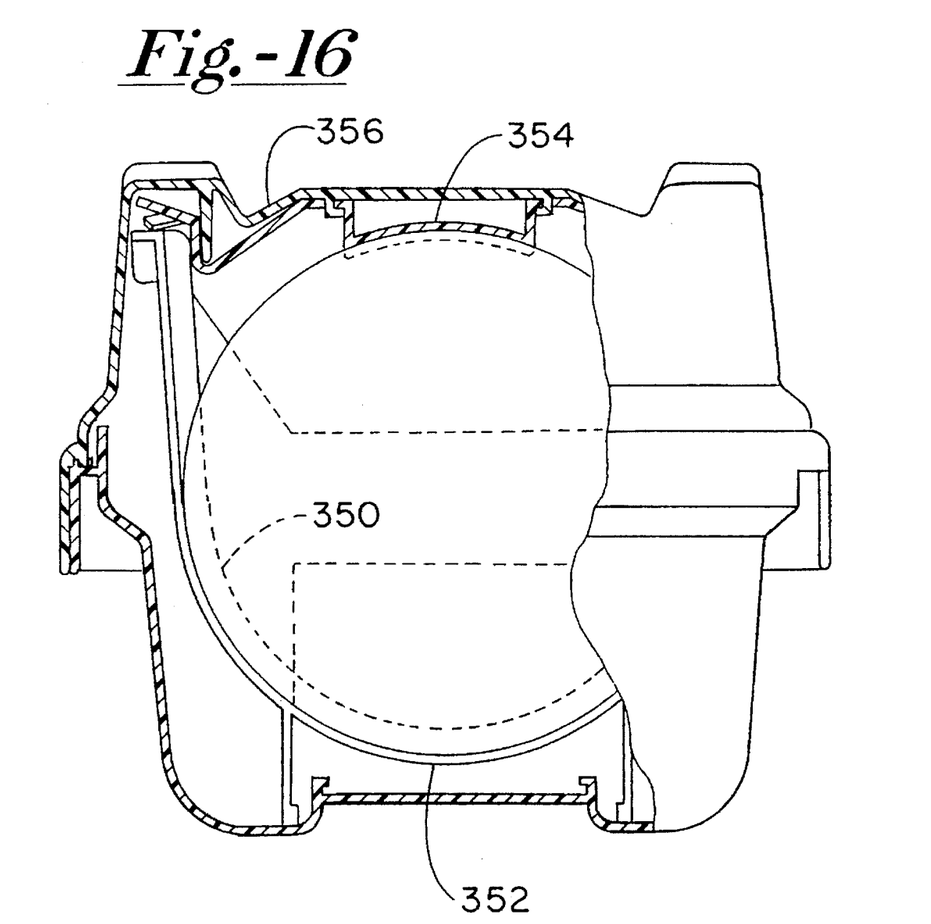
FIG. 16 is a partially cut away cross sectional view of a second alternative embodiment incorporating one cushion.

A third alternative embodiment is shown is FIG. 16. This embodiment incorporates a cassette 250 with a closed bottom surface 252. Only one cushion 254 is necessary and located in the cover 256. All other features of this third embodiment relating the cushion and how its secures to the package are those disclosed with respect to the first cushion embodiment.

MODE OF OPERATION

The cushions 18 and 20 are first placed into the package cover and base. The first cushion embodiment 18 is placed in the cover 12 so that the rails 130 and 132 contact the tracks 84 and 86 and the securing protrusions 131 and 133 of the rails are inserted into the L-shaped securing recesses 95 and 104 of the tracks 84 and 86. The four supporting members 150, 152, 154 and 156 extend through their respective cut away track portion 88, 90, 98 and 100 and follow the contour of the cover. As shown in FIG. 1, member 154 follows angled surface 106 until it reaches wall 110. The supporting member 154 contacts the bottom of the wall 110 and then angles upward between the cassette 14 and wall 110 where end 155 rests freely. FIG. 13 also shows how the supporting members angle to rest on top of the cassette 14.

Likewise, the second cushion embodiment is secured in the base by inserting the securing protrusions 182 and 190 into the recesses 69 and 71 on the L-shaped track portions 65 and 67. The four supporting members extend through the cut away portions 54, 55, 56 and 57. The arcuate portion of the supporting members extend down past the surface 48 to allow the ledges 193, 195, 197 and 199 to rest on the surface of channels 44 and 46 respectively.

The wafer carrier cassette 14 carrying disks is then placed in the bottom 10 so that the bottom edges rest in channels 48 and 50 of the bottom 10. As conventionally practiced in the industry, the cassette 14 can be properly oriented and aligned in only one position with respect to the base 10. The locating index member 31 of the base allows only one proper orientation of the cassette. The "H" shaped member 35 of the cassette 14 engages over the locating index member 31. If the cassette 14 is rotated 180 degrees in either direction about its vertical access, the cassette 14 would not fit in the area occupied by the locating index member 33 in order for the disk carrier, cassette 14 to fit in the bottom 10.

In the first and second alternative embodiments of the cushion package arrangement shown in FIGS. 14 and 15, the disks are inserted into the disk pockets of the base instead of a wafer cassette.

The cover 12 is then positioned over the disks located in the carrier 14 or the base pockets of FIGS. 14 and 15. In order to prevent breakage or scratching of the disks, the cover should be placed straight onto the base 10. The rim 72 of the cover 12 aligns over the rim 34 of the base 10 and the latches 36 and 38 engage latches 74 and 76.

Each disk engaging portion 140 conforms about each disk as shown in FIGS. 11a–c as the disks are received in the respective U-shaped receptacle 142. The first and second angled surfaces 144 and 146 help center the disk edge into the U-shaped receptacle. As the cover 12 is positioned incorporating slightly more downward pressure against the disks the cushions 18 and 20 deform to surround the disk edge as shown in FIG. 1 to securely and gently hold the disk edge. The cushions 18 and 20 will provide proper cushion for a safe shipment of a cassette of disks.

One cushion in the form of the first cushion embodiment is sufficient to meet the objects of the invention because the cushion securely engages the wafers by wrapping around the edge profile and the disks already secured in the disk pockets. The disk cannot slip, pivot or rotate or generating contamination particles once secured.

As the cover rim engages about the base rim and the latch members 36, 38, 74 and 76 engage the inter-engaging relationship between the cassette 14, the bottom 10, the cover 12, the cushions 18 and 20 and the disks occurs during such engagement. This inter-engaging relationship particularly reflects the packages purpose for reducing and eliminating contamination of the disks, as well as providing for storage and transportation of the substrates, wafers and disk products.

The container is suitable for being taped, shrink wrapped or bagged with some suitable type of polyester, polyethylene or mylar film, further providing a non contaminant, container with structural integrity. This also reduces the cost of the container and maintains structural integrity of the wafers supported therein.

It is understood that the above disclosure and presently preferred embodiment is to be taken as illustrative of the invention. The invention may be readily adapted to package a variety of disks by changing the cushions. Furthermore, it is to be understood that those skilled in the art be capable of making modifications without departing from the true spirit and scope of the invention.

What is claimed:

1. A cushion for use in suspending disk products, said cushion comprising a plurality of spaced apart disk engaging members, each disk engaging member spanning a distance between common supports and said common supports oriented perpendicular to said disk engaging members, each said disk engaging member having a flexible disk engaging surface wherein said cushion is made of a material having a flexural creep of less than 1.5% deflection at 60° C. when measured in accordance with ASTM D2990.

2. A cushion system for use in suspending a plurality of disk products, said cushion system comprising:

(a) a first cushion having a plurality of spaced apart disk engaging members spanning common supports, said common supports oriented perpendicular to said plurality of spaced apart disk engaging members, and each said disk engaging member having a flexible disk engaging surface whereby said flexible disk engaging surface conforms to a profile edge of a suspended disk product (b) a second cushion having a concave surface with a plurality of disk engaging members located in said concave surface; and (c) said first and second cushions are made of a material having flexural creep of less than 1.5% deflection at 60° C. when measured in accordance with ASTM D2990.

3. A cushion system for use in suspending a plurality of disk products in a container, said cushion system comprising:

(a) a first cushion having a plurality of spaced apart disk engaging members, each said disk engaging member having a flexible disk engaging surface;

(b) a first and a second support, said first and second supports oriented perpendicular to said plurality of spaced apart disk engaging members and each said disk engaging member spanning said first and second supports;

(c) a first securing means on said first cushion for securing said first cushion to said container, said first securing means having a first portion on said first support and a second portion on said second support;

(d) a second cushion having a concave surface with a plurality of disk engaging members located in said concave surface;

(e) a second securing means on said second cushion for securins said second cushion to said container; and (f) said first and second cushions are made of a material having flexural creep of less than 1.5% deflection at 60° C. when measured in accordance with ASTM D2990.

4. A cushion suspension and packaging apparatus for holding a plurality of disk products, said cushion suspension and packaging apparatus comprising:

(a) a package top having an upper surface and four walls extending transversely from said upper surface;

(b) a package base having a lower surface and four walls extending transversely from said lower surface;

(c) a first cushion having a plurality of parallel spaced apart, disk engaging members, each said disk engaging member having a flexible disk engaging surface whereby said flexible disk engaging surface conforms to a profile edge of a suspended disk product, first and second spaced apart supports oriented perpendicular to said plurality of disk engaging members, each said disk engaging member spans the distance between said first and second supports and said first cushion having means for securing said first cushion to said package top;

(d) a second cushion having a concave surface, a plurality of disk engaging members located in said concave surface and a pair of support members extending transversely from such concave surface with means for securing said second cushion to said package base;

(e) a first cushion securing means located on said upper surface of said package top for securing said first cushion to said package base (f) a second cushion securing means located on said lower surface of said package base for securing said second cushion to said package base; and (g) said first and second cushions are made of a material having flexural creep of less than 1.5% deflection at 60° C. measured in accordance with ASTM D2990.

* * * * *